(12) United States Patent
Weber

(10) Patent No.: US 6,303,990 B1
(45) Date of Patent: Oct. 16, 2001

(54) CONDUCTOR PATH CONTACTING ARRANGEMENT AND METHOD

(75) Inventor: Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/320,603

(22) Filed: May 26, 1999

(30) Foreign Application Priority Data

May 30, 1998 (DE) .............................................. 198 24 400

(51) Int. Cl.⁷ ........................... H01L 23/48; H01L 23/52; H01L 29/40
(52) U.S. Cl. ........................... 257/734; 257/774; 257/750; 257/758; 257/753; 257/775
(58) Field of Search ..................................... 257/734, 774, 257/750, 758, 753, 775; 438/652, 118, 622, 629, 637, 639, 640, 667, 668, 672, 675, 700, 701, 713, 978

(56) References Cited

U.S. PATENT DOCUMENTS

| | | | |
|---|---|---|---|
| 3,577,036 | * 5/1971 | Curtis | 29/576 |
| 4,713,682 | * 12/1987 | Erie et al. | 257/758 |
| 4,827,326 | * 5/1989 | Altman et al. | 257/774 |
| 5,106,780 | * 4/1992 | Higuchi | 438/637 |
| 5,652,182 | * 7/1997 | Cleeves | 438/637 |
| 5,869,393 | * 2/1999 | Tseng | 438/622 |
| 5,888,911 | * 3/1999 | Ngo et al. | 438/788 |
| 6,046,104 | * 4/2000 | Kepler | 438/637 |

* cited by examiner

Primary Examiner—Jhihan B Clark
(74) Attorney, Agent, or Firm—Kenyon & Kenyon

(57) ABSTRACT

A conductor path contacting arrangement for contacting a first conductor path, which is applied on a substrate and covered with a first insulating layer, via a contact hole in the first insulating layer to a second conductor path. The contact hole overlies a region above the first conductor and a region, adjacent thereto, above the substrate; and inside the contact hole the second conductor path is stepped down from the contact region having the first conductor path toward the substrate therebeneath. This allows better control of the contact hole junction resistance.

9 Claims, 4 Drawing Sheets

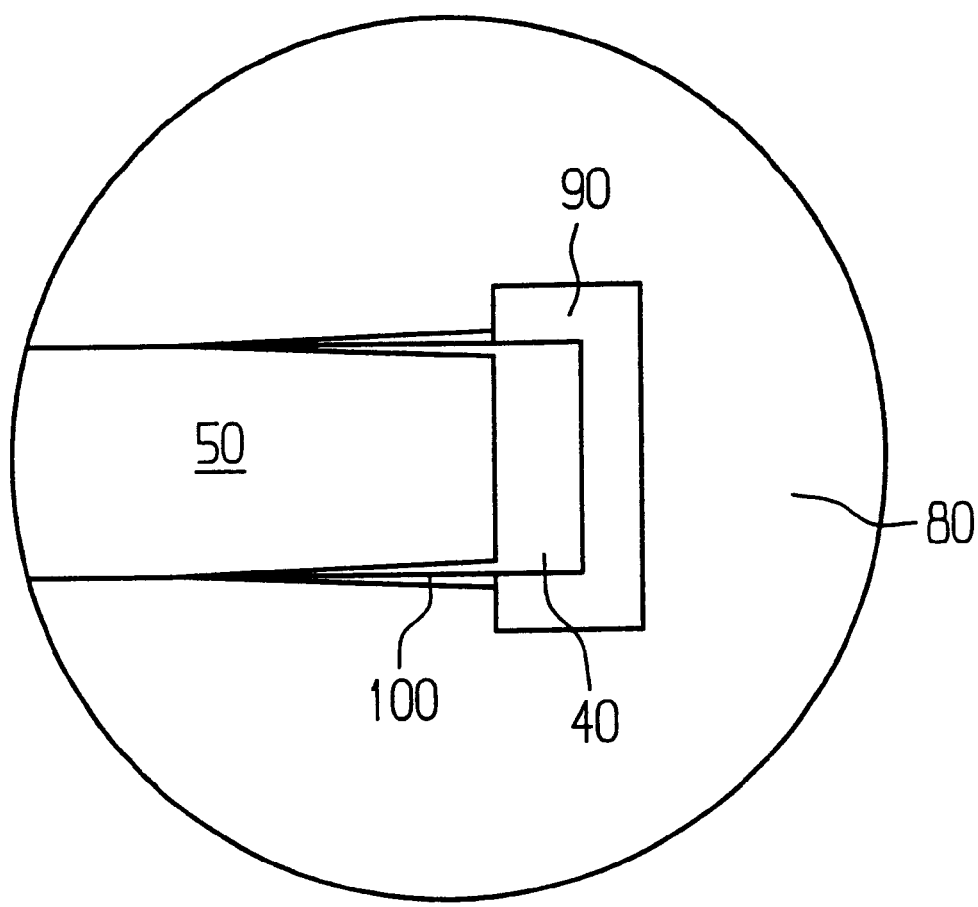

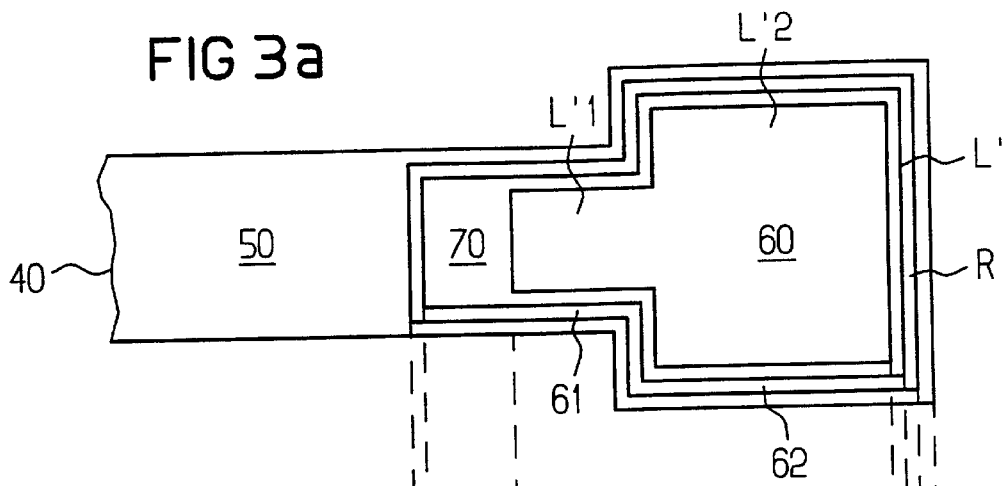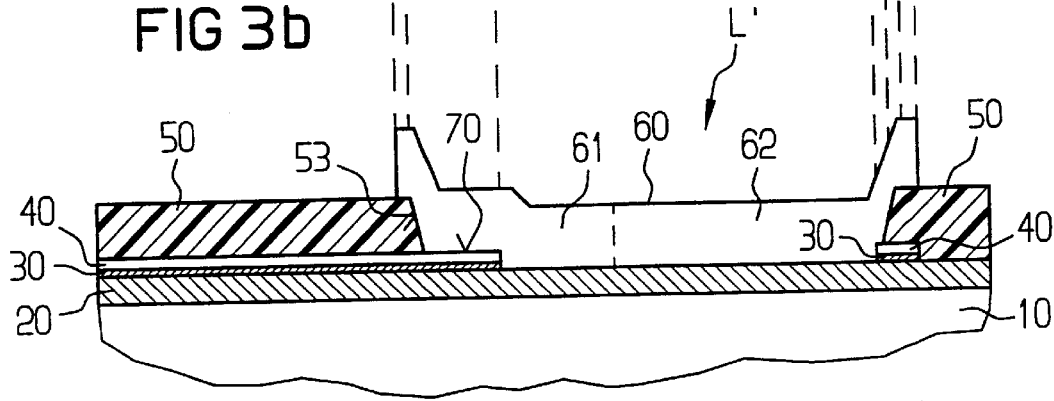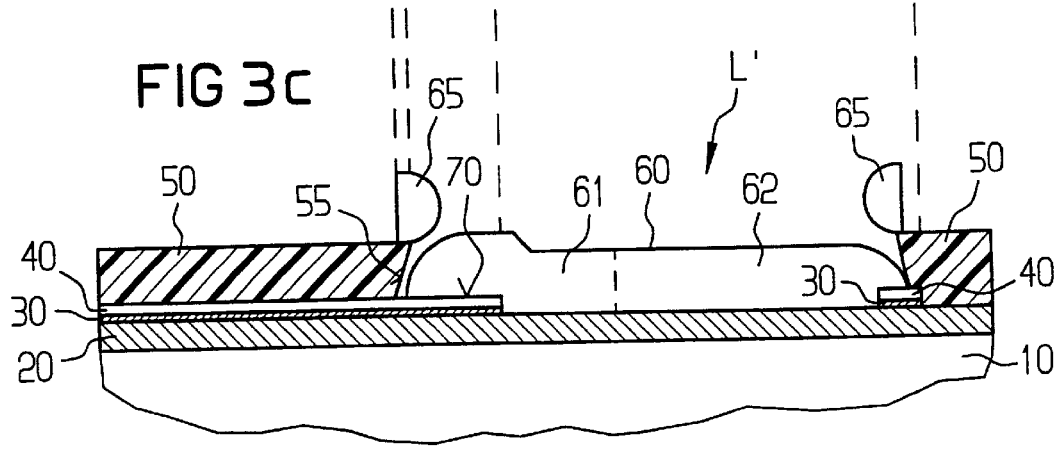

CONDUCTOR PATH CONTACTING ARRANGEMENT AND METHOD

FIELD OF THE INVENTION

The present invention relates to a conductor path contacting arrangement for contacting a first conductor path, which is applied on a substrate and covered with a first insulating layer, via a contact hole in the first insulating layer to a second conductor path; as well as to a corresponding conductor path contacting method.

BACKGROUND INFORMATION

Although applicable to the contacting of any conductor paths, the present invention as well as its underlying object are explained with reference to the contacting of a platinum conductor path applied on a silicon substrate and an aluminum bonding land conductor path.

FIGS. 4a–c are a schematic depiction of a usual contacting arrangement, FIG. 4a being a plan view, FIG. 4b a cross-sectional view with a positive etching flank for the insulating layer, and FIG. 4c a cross-sectional view with a negative etching flank for the insulating layer.

In FIGS. 4a–c, reference character 10 designates a silicon substrate, 40 a platinum conductor path, 50 a CVD oxide, 53 a positive etching flank, 55 a negative etching flank, 60 an aluminum bonding land conductor path, 61 a web region, 62 a land region, 65 pinched-off aluminum pieces, 67 a detachment edge, L a contact hole, and Rc a contact hole junction resistance.

The arrangement shown in FIGS. 4a–c serves to transition the elongated platinum conductor path 40, via a narrow web region 61 of aluminum bonding land conductor path 60, into a wider land region 62 of the aluminum bonding land conductor path 60.

Platinum conductor path 40, running on substrate 10, is first covered completely with the insulating layer made of CVD oxide 50. In the end region of platinum conductor path 40, contact hole L is then opened up in CVD oxide 50 using a usual photolithographic etching process. Contact hole L is spaced away from the edges of the end region of platinum conductor path 40. Deposition and masking of aluminum bonding land conductor path 60 is then performed in order to yield the arrangement shown in FIG. 4a.

In order to evaluate the quality of the contact created in this fashion, contact hole junction resistance Rc between contact hole L in CVD oxide 50 and the corresponding land region 62 of aluminum bonding land conductor path 60 is measured.

Measurement of this contact hole junction resistance Rc serves in particular to characterize the degree to which the contact hole flanks are overlaid with aluminum, as will be explained in further detail below with reference to FIGS. 4b and c.

When contact hole L is opened in wet-chemical fashion, the result is usually the desired positive etching flanks 53 for the CVD oxide, which ensure good overlay of the contact hole flank with aluminum, and thus a low contact hole junction resistance Rc (FIG. 4b).

This standard process can, however, result locally on a wafer in undesired negative etching flanks 55 for the CVD oxide, and thus in high contact hole junction resistances Rc (FIG. 4c). They may be caused by an inhomogeneously grown CVD oxide layer 50 and/or by contaminants at the interface between CVD oxide layer 50 and platinum conductor path 40. Such negative etching flanks at the contact hole edges result, in particular, in pinched-off pieces 65 and detached edges 67, which can result in the elevated contact hole junction resistance Rc and, in the worst case, in an break in aluminum bonding land conductor path 60 and thus failure of the component in question. It has proven disadvantageous that with the aforementioned known approach, a certain proportion (typically a few %) of the components exhibit an elevated contact hole junction resistance Rc with the standard process.

SUMMARY OF THE INVENTION

The conductor path contacting arrangement according to the present invention and the corresponding conductor path contacting method have, in contrast to the known approach, the advantage that because of the special contact hole design, the problem of elevated contact hole junction resistance no longer occurs. Reliable contacting, regardless of the contact hole flanks, is achieved, guaranteeing high production quality and yield.

An underlying idea of the present invention is that the contact hole overlies a region above the first conductor and a region, adjacent thereto, of the substrate; and inside the contact hole the second conductor path is stepped down from the contact region having the first conductor path toward the substrate therebeneath. In other words, the second conductor path has a downward step, and not just an upward step onto the insulating layer as in the existing art. In particular, a smaller step height and thus better step overlay is possible for the downward step. This results, by comparison with the standard process, in independence from the thickness of the insulating layer and from the flank slope of the contact hole.

According to a preferred embodiment, the second conductor path lies substantially inside the contact hole and preferably only its edge region lies on the insulating layer.

According to a further preferred embodiment, the second conductor path is a bonding land conductor path having a narrower web region contacted on the first conductor path and a wider land region adjacent thereto.

According to a further preferred embodiment, the first conductor path has an eye-shaped region, such that the edge of the contact hole lies on the eye-shaped region. This is advantageous in particular when a wet-etching method is used, since in this context etching spikes can occur along edges between the first conductor path and the first insulating layer, and can cause the first insulating layer to be at an undefined distance beneath a resist mask which is preferably used.

According to a further preferred embodiment, the edge of the contact hole lies substantially centrally on the eye-shaped region. This helps compensate for process tolerances.

According to a further preferred embodiment, a second insulating layer is provided on the substrate, as an electrical insulator and/or adhesion layer for the first and second conductor paths.

According to a further preferred embodiment, a third insulating layer or conductive layer is provided on the substrate or on the second insulating layer, as an adhesion layer for the first conductor path.

According to a further preferred embodiment, the first and/or second insulating layer comprises multiple insulating layers.

According to a further preferred embodiment, the first and/or second insulating layer includes a combination of electrically conductive a nonconductive layers.

BRIEF DESCRIPTION OF THE DRAWINGS

FIG. 2 shows a schematic depiction illustrating the etching spike problems which can occur with the first embodiment in the case of a wet-chemical etching method.

FIG. 3a shows a plan view of a schematic depiction of a second embodiment of the contacting arrangement of the present invention.

FIG. 3b shows a cross-sectional view, with a positive etching flank for the insulating layer, of the second embodiment.

FIG. 3c shows a cross-sectional view, with a negative etching flank for the insulating layer, of the second embodiment.

DETAILED DESCRIPTION

Figure 1A:
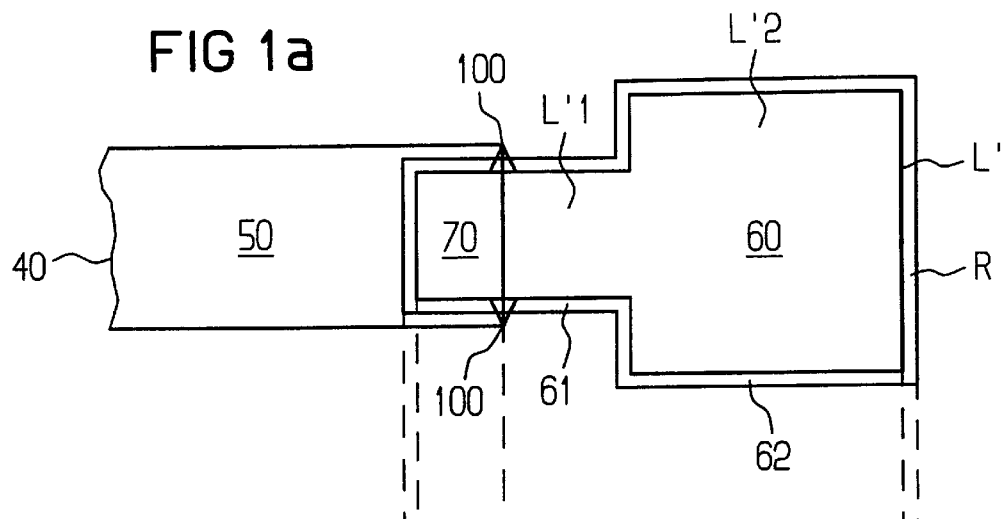
FIG. 1a shows a plan view of a schematic depiction of a first embodiment of the contacting arrangement of the present invention.

In the Figures, identical reference characters designate identical or functionally identical elements.

Figure 1B:
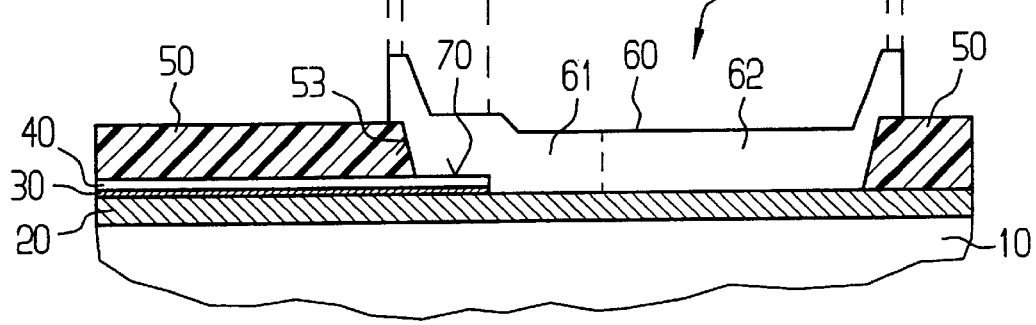
FIG. 1b shows a cross-sectional view, with a positive etching flank for the insulating layer, of the first embodiment.
Figure 1C:
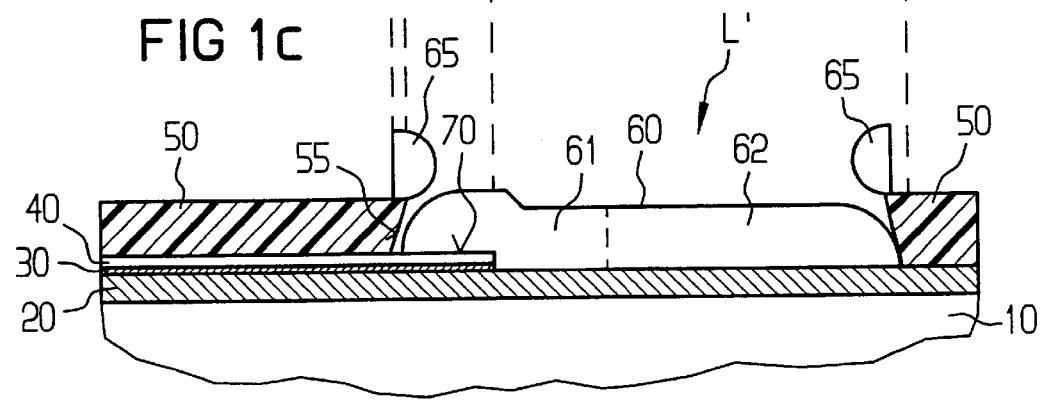
FIG. 1c shows a cross-sectional view, with a negative etching flank for the insulating layer, of the first embodiment.
Figure 4A:
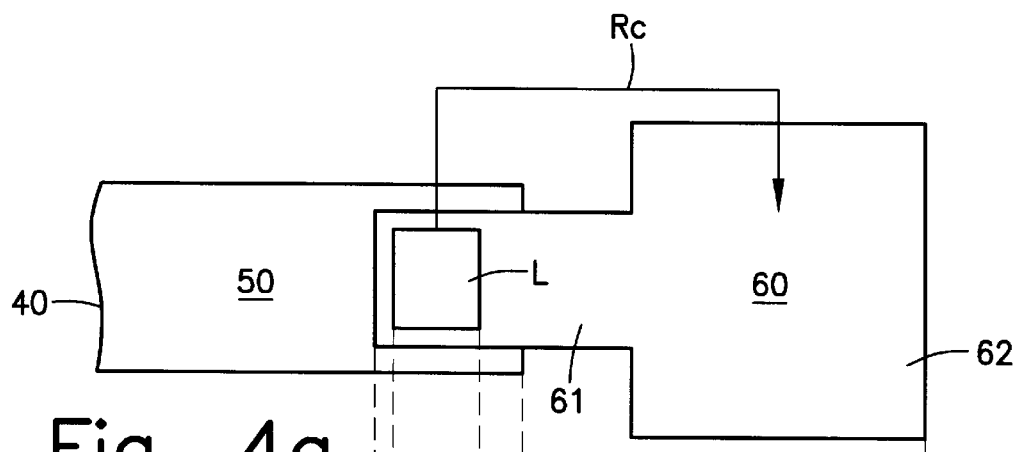
FIG. 4a shows a plan view of schematic depiction of a conventional contacting arrangement.
Figure 4B:
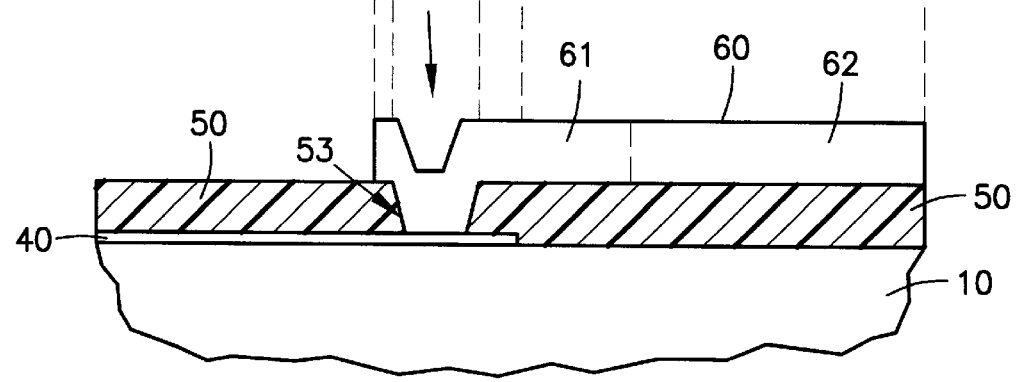
FIG. 4b shows a cross-sectional view, with a positive etching flank for the insulating layer, of the conventional contacting arrangement.
Figure 4C:
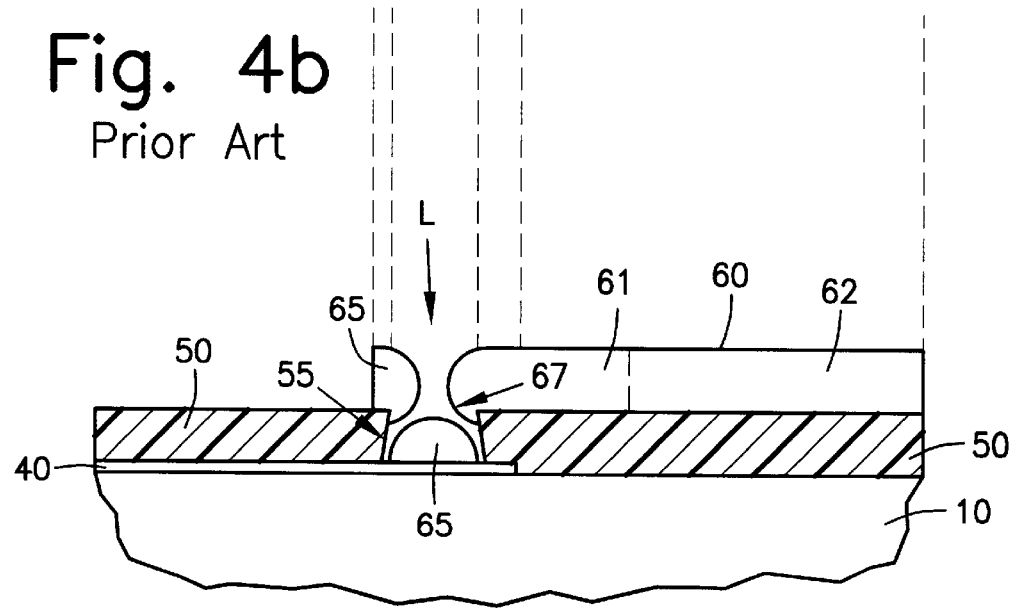
FIG. 4c shows a cross-sectional view, with a negative etching flank for the insulating layer, of the conventional contacting arrangement.

FIGS. 1a–c are a schematic depiction of a first embodiment of the contacting arrangement of the present invention, FIG. 1a being a plan view, FIG. 1b a cross-sectional view with a positive etching flank for the insulating layer, and FIG. 1c a cross-sectional view with a negative etching flank for the insulating layer.

In FIGS. 1a–c, in addition to the reference characters already introduced, L' designates a contact hole, L'1 a web contact hole region, L'2 a land contact hole region, R an edge region of aluminum bonding land conductor path 60, 70 a contact region between platinum conductor path 40 and aluminum bonding land conductor path 60, 20 a nitride layer, 30 an adhesion layer made of "reox" (reoxidized silicon nitride), and 100 etching spikes.

As illustrated in FIGS. 1a–c, in this first embodiment, contact hole L' has a region above platinum conductor path 40 and a region, adjacent thereto, above nitride layer 20. Inside contact hole L', aluminum bonding land conductor path 60 is stepped down from contact region 70, with platinum conductor path 40, toward nitride layer 20, i.e. toward substrate 10. Aluminum bonding land conductor path 60, with narrower web region 61 contacted on platinum conductor path 40 in contact region 70 and with wider land region 62 adjacent thereto, lies substantially inside contact hole L' and only its edge region R lies on CVD oxide layer 50.

In this first embodiment, aluminum bonding land conductor path 60 is deposited not on CVD oxide 50 but rather on nitride layer 20, yielding a lower step height with respect to platinum conductor path 40 and better overlay of the step in question with aluminum.

Both the situation shown in FIG. 1b with a positive etching flank 53, and the situation shown in FIG. 1c with a negative etching flank 55, yield good results for contact junction resistance Rc, since detachment of the aluminum can no longer occur. The magnitude of the junction resistance can be adjusted via the size of region 70 at the end of platinum conductor path 40. The position of land region 62 and narrower web region 61 on nitride layer 20 moreover ensures good adhesion between the aluminum and substrate 10. The placement of land region 62 and narrower web region 61 on nitride layer 20 requires a contact hole L' which projects beyond platinum conductor path 40. If contact hole L' is opened using a plasma or ion-beam etching method, no further actions need to be taken. If, however, contact hole L' is opened using a wet-etching method, problems can occur due to etching spikes 100, whose propagation direction is depicted with arrows in FIG. 1a.

FIG. 2 is a schematic depiction to explain these etching spike problems which can occur with the first embodiment in the case of a wet-chemical etching method.

In FIG. 2, in addition to the reference characters already introduced, 80 designates a photoresist on CVD oxide 50, and 90 a contact hole window. It is clearly evident that etching spikes 100 can occur along edges between the platinum conductor path and the CVD oxide, and cause the CVD oxide to be at an undefined distance beneath the mask of photoresist 80.

FIGS. 3a–c are a schematic depiction of a second embodiment of the contacting arrangement of the present invention, FIG. 3a being a plan view, FIG. 3b a cross-sectional view with a positive etching flank for the insulating layer, and FIG. 3c a cross-sectional view with a negative etching flank for the insulating layer.

In order to counteract etching spikes 100 in the case where a wet-etching method is used, in this second embodiment, platinum conductor path 40 has an eye-shaped region which is arranged around the contours of aluminum bonding land conductor path 60. The edge of contact hole L' lies substantially centrally on the eye-shaped region. Here again, only edge region R of aluminum bonding land conductor path 60 lies on CVD oxide 50.

The overetching time for contact hole L' in CVD oxide 50 should be kept as short as possible, since platinum conductor path 40 is located on a reox layer that is typically about 10 nm thick, and a slight underetching of the platinum layer inevitably occurs inside contact hole L'. Because of the high degree of overlay of the platinum/reox step with aluminum (thickness ratio approximately 1:6), just as in the case of the first embodiment, no edge detachments occur in the aluminum, either with a positive etching flank 53 (FIG. 3b) or with a negative etching flank 55 (FIG. 3c).

In addition, any cavities which might occur due to the application of aluminum inside the eye-shaped region between platinum conductor path 40 and nitride layer 20 can be closed up again during subsequent aluminum tempering thanks to the formation of an intermetallic phase between Pt and Al.

Although the present invention is described above with reference to a preferred exemplary embodiment, it is not limited thereto, but rather can be modified in numerous ways.

In particular, the materials of the metallic conductor paths, the adhesion layer, and the insulation materials are cited only by way of example, and can be replaced with correspondingly' suitable materials. A substrate other than silicon can also be used.

Lastly, the geometry of the contact window is not limited to the geometry shown, and can be modified to different shapes.

List of Reference Characters

L Contact hole
Rc Contact hole junction resistance
10 Silicon substrate
40 Platinum conductor path
50 CVD oxide
53 Positive etching flank
55 Negative etching flank
60 Aluminum bonding land conductor path
61 Web region
62 Land region
65 Pinched-off aluminum pieces
67 Detachment edge
R Edge region of 60
L' Contact hole
L'1 Web contact hole region
L'2 Land contact hole region
70 Contact region
20 Nitride layer
30 Reox adhesion layer
100 Etching spikes
80 Photoresist
90 Contact hole window

What is claimed is:

1. A conductor path contacting arrangement comprising:
   a substrate;
   a first conductor path situated on the substrate;
   a first insulating layer covering the first conductor path, the first insulating layer having a contact hole; and
   a second conductor path, the arrangement contacting the first and second conductor paths, via the contact hole in the first insulating layer;
   wherein the second conductor path is a bonding land conductor path having a narrower web region contacted on the first conductor path and a wider land region adjacent to the narrower web region;
   wherein the contact hole overlies a first region above the first conductor path and a second region, adjacent to the first region, above the substrate; and
   wherein, inside the contact hole, the second conductor path is stepped down from a contact region having the first conductor path toward the substrate therebeneath.

2. The arrangement according to claim 1, wherein the second conductor path lies substantially inside the contact hole, and an edge region of the second conductor path lies on the first insulating layer.

3. The arrangement according to claim 1, wherein the first conductor path has an eye-shaped region, and an edge of the contact hole lies on the eyeshaped region.

4. The arrangement according to claim 3, wherein the edge of the contact hole lies substantially centrally on the eye-shaped region.

5. A conductor path contacting arrangement comprising:
   a substrate;
   a first conductor path situated on the substrate;
   a first insulating layer covering the first conductor path, the first insulating layer having a contact hole;
   a second conductor path, the arrangement contacting the first and second conductor paths, via the contact hole in the first insulating layer;
   wherein the contact hole overlies a first region above the first conductor path and a second region, adjacent to the first region, above the substrate;
   wherein, inside the contact hole, the second conductor path is stepped down from a contact region having the first conductor path toward the substrate therebeneath; and
   a second insulating layer situated on the substrate, the second insulating layer being at least one of an electrical insulator and an adhesion layer for the first and second conductor paths.

6. The arrangement according to claim 5, further comprising one of a third insulating layer and a conductive layer situated on one of the substrate and the second insulating layer, as an adhesion layer for the second conductor path.

7. The arrangement according to claim 5, wherein at least one of the first and second insulating layers includes a plurality of insulating layers.

8. The arrangement according to claim 5, wherein at least one of the first and second insulating layers includes a combination of electrically conductive and nonconductive layers.

9. A conductor path contacting arrangement comprising:
   a substrate;
   a first conductor path situated on the substrate;
   a first insulating layer covering the first conductor path, the first insulating layer having a contact hole;
   a second conductor path, the arrangement contacting the first and second conductor paths, via the contact hole in the first insulating layer;
   wherein the contact hole overlies a first region above the first conductor path and a second region, adjacent to the first region, above the substrate; and
   wherein, inside the contact hole, the second conductor path is stepped down from a contact region having the first conductor path toward the substrate therebeneath; and
   an adhesion layer situated beneath a bonding land conductor path.

* * * * *